(12) United States Patent
Ovshinsky et al.

(10) Patent No.: US 7,186,999 B2
(45) Date of Patent: Mar. 6, 2007

(54) ERROR REDUCTION CIRCUIT FOR CHALCOGENIDE DEVICES

(75) Inventors: Stanford R. Ovshinsky, Bloomfield Hills, MI (US); Morrel H. Cohen, Bridgewater, NJ (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 247 days.

(21) Appl. No.: 11/064,637

(22) Filed: Feb. 24, 2005

(65) Prior Publication Data
US 2006/0198186 A1    Sep. 7, 2006

(51) Int. Cl.
*H01L 29/06* (2006.01)
(52) U.S. Cl. .................. 257/5; 257/2; 257/4; 257/202; 257/E31.029; 365/185.05; 365/148; 365/163
(58) Field of Classification Search ........ 257/E31.029, 257/2, 537–543, 295–296; 365/163, 158, 365/148, 185.05
See application file for complete search history.

(56) References Cited

U.S. PATENT DOCUMENTS 6,087,674 A * 7/2000 Ovshinsky et al. ............ 257/2

* cited by examiner

*Primary Examiner*—Daniel Swerdlow
*Assistant Examiner*—Juan White
(74) *Attorney, Agent, or Firm*—Kevin L. Bray; Marvin S. Siskind

(57) ABSTRACT

An error reduction circuit for use in arrays of chalcogenide memory and computing devices. The error reduction circuit reduces the error associated with the output response of chalcogenide devices. In a preferred embodiment, the output response is resistance and the error reduction circuit reduces errors or fluctuations in the resistance. The error reduction circuit includes a network of chalcogenide devices, each of which is nominally equivalent and each of which is programmed into the same state having the same nominal resistance. The inclusion of multiple devices in the network of the instant error reduction circuit provides for a reduction in the contributions of both dynamic fluctuations and manufacturing fluctuations to the error in the output response.

21 Claims, 4 Drawing Sheets

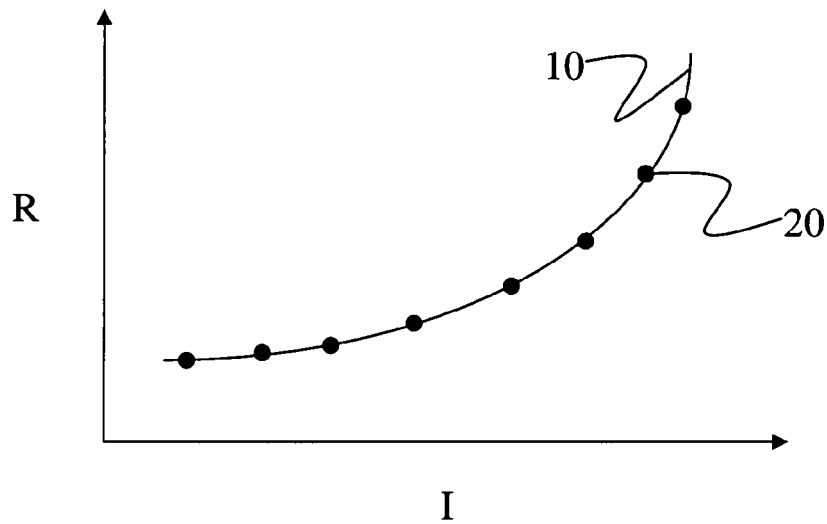
FIG - 1
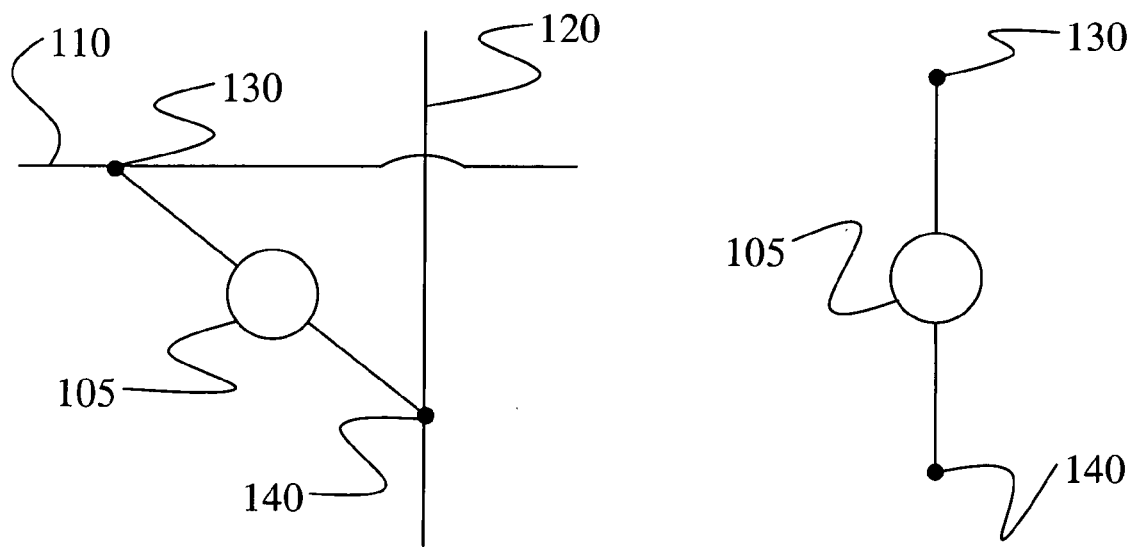
FIG – 2A                              FIG – 2B

ERROR REDUCTION CIRCUIT FOR CHALCOGENIDE DEVICES

FIELD OF INVENTION

This invention relates to networks of chalcogenide devices. More particularly, this invention relates to networks of chalcogenide devices displaying reduced read-out error.

BACKGROUND OF THE INVENTION

Chalcogenide materials are an emerging class of commercial electronic materials that exhibit switching, memory, logic, and processing functionality. The basic principles of chalcogenide materials were discovered, and continue to be developed, by S. R. Ovshinsky. The important classes of chalcogenide-based devices include switching devices, memory devices and cognitive devices.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds for over $10^{13}$ cycles.

Another important group of chalcogenide devices are the memory devices. Chalcogenide materials are capable of adopting a crystalline state, an amorphous state and a variety of intermediate structural states with continuously variable proportions of crystalline phase domains and amorphous phase domains in a given volume. The crystalline state is the most conductive state and exhibits the lowest resistance, while the amorphous state is the least conductive state and exhibits the highest resistance. The intermediate states exhibit intermediate resistances that vary with the relative proportion of the crystalline and amorphous phases present. The difference in resistance between the crystalline and amorphous states of a chalcogenide material is commonly several orders of magnitude.

One type of chalcogenide memory device utilizes the wide range of resistance values available for the material as the basis of memory operation. Each resistance value corresponds to a distinct structural state of the chalcogenide material and one or more of the states can be selected and used to define memory states. Each memory state corresponds to a distinct resistance value and each memory resistance value signifies unique informational content. Operationally, the chalcogenide can be programmed into a particular memory state by providing an electric current pulse of appropriate amplitude and duration. Each memory state can be programmed by providing the current pulse characteristic of the state and each state can be read in a non-destructive fashion by measuring the resistance and thus identifying the state. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market.

Chalcogenide materials also possess a cognitive mode of functionality that serves as another mechanism of memory and that further provides neuron-like properties. In the cognitive mode of operation, a series of structural states is also utilized, but the crystalline phase portion of each of the states is kept at or below the percolation threshold. The states include a series of pre-percolation states, all of which have a relative high resistance, and a set state, which state has a substantially lower resistance than the pre-percolation states and which state corresponds to attainment of the percolation threshold. The available pre-percolation states extend from the amorphous phase of the chalcogenide material to a state having both amorphous and crystalline regions, where the crystalline region is on the verge of crossing the percolation threshold.

Transformations among the pre-percolation states occur by applying energy (for example, electrical energy in the form of current pulses) to the chalcogenide material. Each increment of energy provided to the chalcogenide material induces an increase in the crystalline volume fraction of the chalcogenide material, thereby transforming the material from one pre-percolation state to another pre-percolation state. Since the material lacks a crystalline percolation pathway when it is in its pre-percolation states, the resistance remains high and fairly uniform as the material traverses the different states. Eventually, the crystalline region will have a sufficient volume fraction and will be so situated within the material that percolation is achieved and a contiguous crystalline pathway is formed across the material. At this point, the chalcogenide material sets and a substantial decrease in resistance occurs. Further operation of the material occurs by applying energy in an amount sufficient to reset the material to one of the pre-percolation states.

The energy applied to the chalcogenide material during the transformations between states in the cognitive mode of operation is less than that typically required to transform between the resistance states of the OUM memory. The behavior of the chalcogenide material in the cognitive mode is reminiscent of the biological neuron in that the material accumulates energy as it progresses from one pre-percolation state to the next and fires upon reaching the percolation threshold and transforming to the set state. Each of the pre-percolation states has a structural configuration of crystalline phase material that reflects the net accumulated energy of all energy increments applied to the material since the last reset operation.

The behavior (including switching, memory, accumulation and cognitive operation) and chemical compositions of chalcogenide materials included within the scope of this invention have been described, for example, in the following U.S. Pat. Nos. 6,671,710; 6,714,954; 6,087,674; 5,166,758; 5,296,716; 5,534,711; 5,536,947; 5,596,522; 5,825,046; 5,687,112; 5,912,839; 3,271,591 and 3,530,441, the disclosures of which are hereby incorporated by reference. These references also describe proposed mechanisms that govern the behavior of the chalcogenide materials. The references also describe the structural transformations from the crystalline state to the amorphous state (and vice versa) via a series of partially crystalline states in which the relative proportions of crystalline and amorphous regions vary underlying the operation of electrical and optical chalcogenide materials.

Current commercial development of the chalcogenide materials and devices is oriented toward the fabrication of arrays of devices. Chalcogenide materials offer the promise of high density memory, logic and neural arrays that can operate according to traditional binary data storage or according to a multilevel scheme. Chalcogenide arrays further offer the prospect of integrating, on a single chip, both memory and processing capabilities, thereby enabling high speed operation. The neural functionality provides an opportunity to achieve heretofore unavailable degrees of parallelism as well. Chalcogenide based computational arrays are desirable from a processing point of view since they can be fabricated in an all thin film package that can be readily integrated with conventional silicon devices.

In order to maximize the advantages offered by the chalcogenide materials, it is necessary to form arrays that include a large number of devices, where each device is as small as possible, and, in forming such arrays, to minimize errors in the output response. Strategies for minimizing errors in the reading and writing of data from chalcogenide arrays are desired in the art to further extend the available range of applications.

SUMMARY OF THE INVENTION

In this invention, we present a circuit of chalcogenide devices that is configured to provide an output response whose error is reduced relative to the error associated with the individual devices of the circuit. The error-reducing circuit comprises a series, parallel or series-parallel network of chalcogenide devices whose configuration is such that the overall variance of the output response of the circuit is less than the variance of the individual devices that make up the circuit. The chalcogenide networks of the instant error reduction circuits can include a square (n×n), rectangular (n×m) or linear (n×1 or 1×n) combination of chalcogenide devices.

In one embodiment, the instant error reduction circuit provides for a reduction in the contribution of dynamic fluctuations to the error associated with the readout of the output response. In another embodiment, the instant error reduction circuit provides for a reduction in the contribution of manufacturing fluctuations to the error associated with the readout of the output response. In still another embodiment, the instant error reduction circuit provides for a reduction in the contributions of both the dynamic and manufacturing fluctuations to the error associated with the readout of the output response.

The instant error reduction circuit can be used to interconnect conductive strips to form array element that can be used to form arrays, where the readout error of the array elements is reduced relative to the readout error of an analogous array having only a single chalcogenide device at each array element.

BRIEF DESCRIPTION OF THE DRAWINGS

FIG. 1. Operational characteristics of a representative chalcogenide memory device.

FIG. 2A. Schematic depiction of an array element including a chalcogenide device interconnected between two conductive strips.

FIG. 2B. The chalcogenide device of FIG. 2A, including contacts.

DETAILED DESCRIPTION OF THE ILLUSTRATED EMBODIMENTS

Figure 3A:
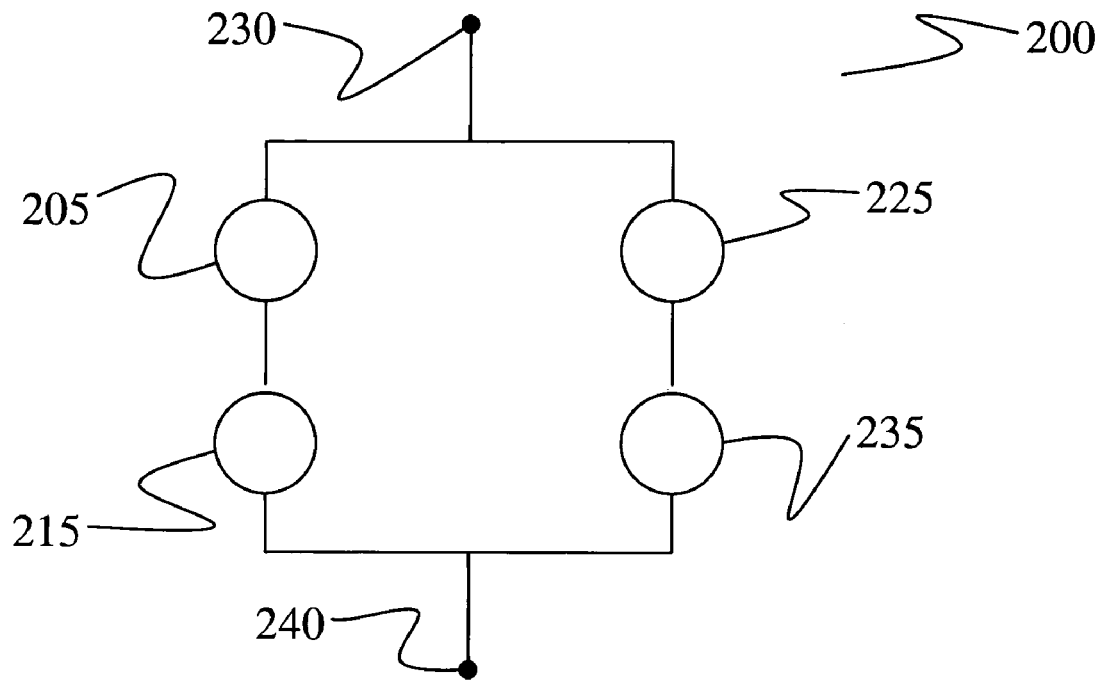
FIG. 3A. Schematic depiction of an error reduction circuit that includes a 2×2 network of chalcogenide devices arranged in a series-parallel configuration according to one embodiment of the instant invention.

An important objective in the development of chalcogenide electronics is the fabrication of devices and arrays having an output response that is highly reproducible over multiple cycles of operation. Reproducibility of the output response is influenced by operational parameters associated with the processes associated with the reading and writing of data to the devices, the processes involved in programming the devices, and by the methods used in the fabrication of the devices.

In the case of chalcogenide devices, the output response is typically in the form of a resistance and the reading process entails the measurement of a device resistance that is governed by the state of the chalcogenide material. The resistance measurement can be obtained by providing a voltage to the device and measuring a current through the device, or by providing a current to the device and measuring a voltage across the device. In either case, an objective of the read process is to prevent the alteration of the state of the chalcogenide material so that the information content stored therein is not changed during the reading operation. In practice, this is accomplished by providing read voltages or read currents that are too low to alter the state of the material, so that the read is non-destructive. Due to the non-destructive nature of the read process, it is expected that reading the devices introduce no significant error to the output response.

The writing process involves the application of energy to the chalcogenide material in an amount sufficient to program the chalcogenide material to a desired state. The state may be a cognitive state or a memory state, as described hereinabove. The writing process can be accomplished through any form of energy input and is most commonly accomplished through the application of electrical energy in the form of current pulses. In order to program the chalcogenide material, the amplitude and duration of the pulses must be controlled so that the energy provided to the material corresponds to the energy needed to induce a transformation of the chalcogenide material to the desired programming state. On repeated operation, fluctuations in the duration or amplitude of the applied current pulses relative to those intended lead to fluctuations in the energy provided to the chalcogenide material. These fluctuations, in turn, lead to fluctuations in the state to which the material is programmed and this results in fluctuations in the output response of the device. Deviations of the measured resistance from the intended value constitute an error in the output response and fluctuations in operational characteristics used to provide energy to the chalcogenide material, such as pulse amplitude or pulse duration, represent a contribution to the error. Since these errors represent unintended variations in output response upon repeated programming of the material, these errors may be referred to herein as dynamic errors, dynamic variations, dynamic fluctuations or the like.

Another potential source of errors in the output response is deviations in the fabrication process from the intended design of the device. Deviations can occur in the deposition process used to form the chalcogenide material and in other processing steps needed to form the device package. The chalcogenide material is formed through a physical or chemical deposition technique such as sputtering, physical vapor deposition, chemical vapor deposition etc. and each of these techniques requires control of a number of different processing parameters. Fluctuations in the processing parameters can lead to deviations in the composition and/or quality of the chalcogenide material relative to the intended design. Factors such as processing temperatures, pressures, amounts or flow rates of deposition precursors, deposition time, and purity can affect the properties of the deposited chalcogenide material. Deviations in composition or quality lead to deviations in the output response of the material for a particular programming condition. Similarly, device formation requires the placement of electrodes in contact with the chalcogenide material as well as placement of surrounding protective or dielectric layers. Fluctuations in the formation of the peripheral components of the chalcogenide device can also contribute to an error in the output response. Errors that result from deviations from the intended device design may be referred to herein as manufacturing errors, manufacturing fluctuations, manufacturing variations or the like. Manufacturing errors become especially important in the fabrication of larger device arrays since larger arrays require uniformity of the device properties over a large number of devices.

A reduction in the errors of the output response of a device can be controlled through strict quality control over the methods and instrumentation used to program and form devices. At some point, however, a point of diminishing returns is reached at which the cost of achieving better control over the errors outweighs the reduction of error achieved. Ultimately, the fundamental limits within a particular set of operational and production methods are reached and further improvements require the adoption of new technologies. Due to the high costs associated with development of the new infrastructure, however, it is generally more cost effective, at least in the short term, to fully optimize existing technologies and to develop other strategies for reducing errors.

In the instant invention, a general approach to improving the reliability of the output response of chalcogenide devices is presented. The approach involves the use of combinations of devices, as opposed to single devices, to store and return information. The instant device combinations may be referred to herein as error reduction circuits. The instant inventors demonstrate herein a reduction in the error of the output response of the circuit that scales quadratically with the number of devices included in the circuit. Thus, even though there is redundancy in the number of devices used to establish a particular programming state, the instant invention nonetheless provides a significant net benefit in error reduction.

Representative advantages of the instant invention can be illustrated by considering chalcogenide memory devices of the multistate, OUM type described hereinabove. A schematic operational curve for this type of chalcogenide memory device is depicted in FIG. 1 herein. The operational curve 10 of FIG. 1 represents the variation of the resistance R of a multistate memory device as a function of the amplitude I of an applied current pulse have a fixed duration. Representative memory or programming states 20 are also shown. Associated with each state is a resistance R, the value of which is characteristic of the state. Each of the states can be associated with a unit of information such as a number, letter, character, word, etc. and the output response of the device, most conveniently in the form of a measurement of the resistance of the device, identifies the state of the device and provides the information content of the current state of the device. Also associated with each of the states is a current amplitude, the value of which corresponds to the current required to program the device into the particular state. The chalcogenide memory devices of this type feature direct overwrite, so that the device can be programmed from any one of the states to any other state by applying a current pulse having the requisite amplitude. The programming states 20 shown in FIG. 1 are representatively selected states. A continuous range of states is available from the chalcogenide material and many different subsets of states, having a large or small number of states and/or a large or small interval of resistances therebetween, can be selected in actual operation.

In a preferred embodiment, the difference in resistance between the highest resistance state and the lowest resistance state of the subset is at least a factor of 10. In a more preferred embodiment, the difference in resistance between the highest resistance state and the lowest resistance state of the subset is at least a factor of 100. In a preferred embodiment, the difference in resistance between the highest resistance state and the lowest resistance state of the subset is at least a factor of 1000.

FIG. 2A shows a depiction of a chalcogenide device in a configuration that is typical of operation. The device 105 comprises a chalcogenide material and is connected to conductive strip 110 at contact 130 and conductive strip 120 at contact 140. The device 105 is interconnected between conductive strips 110 and 120. The conductive strip 110 may be a conductive line, such as an addressing line, and may be referred to herein as an "X-line" and the conductive line 120 may be also be a conductive line, such as an addressing line, and may be referred to herein as a "Y-line". Typically during operation, programming signals are provided to the X-line and output signals are obtained from the Y-line. The configuration shown in FIG. 2A is representative of a device configuration at a single node of an array. The configuration shown in FIG. 2A may also be referred to herein as an array element since it represents a device configuration at the intersection of conductive strips in an array. FIG. 2B shows a close-up depiction of the portion of FIG. 2A in the vicinity of the device.

As described hereinabove, we can identify dynamic variations and manufacturing variations as sources of error in the output response of a device. If we consider a single device in a particular state, the contribution of the dynamic variation to the resistance of the state can be written $$R = R^0 + \Delta_1 R$$

where R is the measured resistance of the device in the state at a particular instant during operation of the device, $R^0$ is a time-averaged mean resistance of the device in the state and $\Delta_1 R$ is the dynamic fluctuation about the mean. The mean value $R^0$, in turn, will deviate from its design value $R_0$ because of manufacturing fluctuations. The contribution of the manufacturing fluctuations to the mean value can be written $$R^0 = R_0 + \Delta_2 R$$

where $\Delta_2 R$ represents the manufacturing fluctuation. The measured resistance R becomes $$R = R_0 + \Delta_1 R + \Delta_2 R$$

or, more simply, $$R = R_0 + \Delta R$$

where $\Delta R$ measures the deviation of the resistance of the device from its design value and is given by $$\Delta R = \Delta_1 R + \Delta_2 R$$

In practice, in the case of a single device, the manufacturing fluctuation has little significance since the performance of the device can be calibrated to offset it.

We now consider the effect of substituting a circuit containing two or more devices for a single device on the dynamic and manufacturing fluctuations of the output response. The circuit of the instant invention is a series-parallel combination of two or more single devices and may be referred to herein as an error reduction circuit or error reduction circuit that includes a network of chalcogenide devices, for reasons that we illustrate below.

Figure 3B:
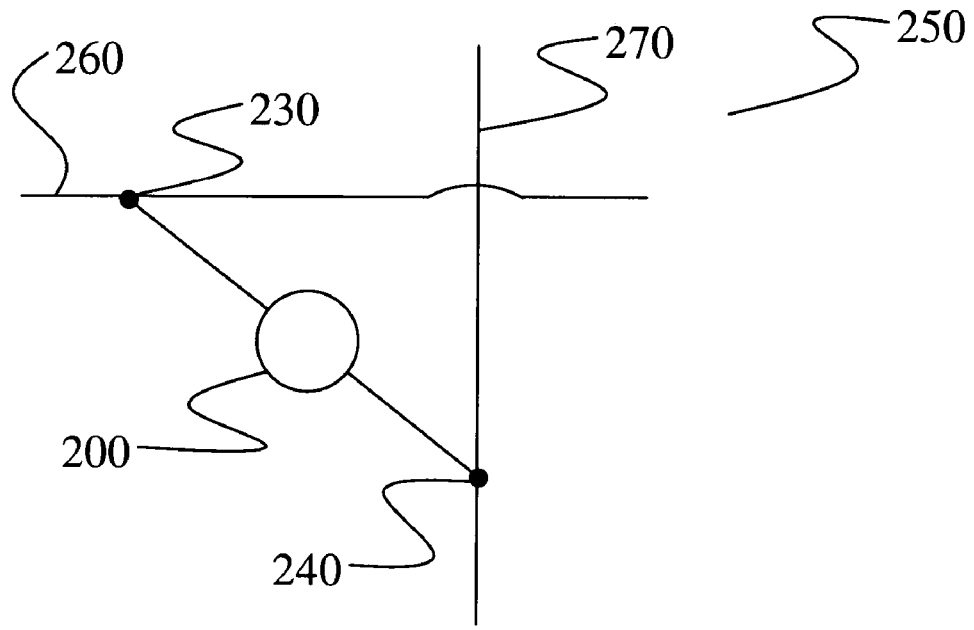
FIG. 3B. An array element including the error reduction circuit of FIG. 3A interconnected between conductive strips.

A schematic depiction of a representative error reduction circuit according to the instant invention is shown in FIG. 3A. FIG. 3A illustrates a four-device error reduction circuit 200 that includes a network of chalcogenide devices 205, 215, 225, and 235 as well as contacts 230 and 240. The devices are arranged in a 2×2 series-parallel combination. The 2×2 series-parallel combination may also be referred to herein as a 2×2 network. Contacts 230 and 240 may represent, for example, contacts to an X-line and Y-line, respectively, or contacts between any pair of conductive strips. The error reduction circuit 200 may be used as a nodal device at the intersection of conductive strips in an array, such as depicted in FIG. 3B. FIG. 3B shows array element 250 that includes error reduction circuit 200 interconnected between conductive strip 260 and conductive strip 270.

The general error reduction circuit of the instant invention can include an arbitrary number of devices placed in series, in parallel or in a series-parallel combination between contact points to interconnect conductive strips. In a preferred embodiment, the instant circuit includes an n×m network of devices. In a particularly preferred embodiment, the instant circuit includes an n×n network of devices.

In a preferred embodiment, the chalcogenide devices within a network of the instant error reduction circuit are nominally equivalent. Each device within the network is susceptible to the dynamic and manufacturing fluctuations described hereinabove. The advantages afforded by the instant error reduction circuit can be demonstrated by considering the effect of increasing the number of devices in the circuit on the overall error or fluctuation of the network within the circuit and comparing this error with that of a single device.

For illustration purposes, we consider an error reduction circuit that includes an n×n network. We assume the devices are nominally equivalent and are programmed into the same processing or memory state. We use the indices i and j as labels to refer to different devices in the network, where the index i designates the row position of a device and index j designates the column position of a device in the network. The indices i and j run from 1 through n. The resistance of the device in the $i^{th}$ row and $j^{th}$ column when in the particular state is given by $R_{ij}$.

The overall resistance R of the network is given by $$R = \left[ \sum_j \frac{1}{\sum_i R_{ij}} \right]^{-1} \quad (1)$$

As described hereinabove, each device will exhibit a dynamic fluctuation during operation about a mean value. We let $R_{ij}^0$ designate the mean resistance value and $\Delta_1 R_{ij}$ designate the dynamic fluctuation of the device in the $i^{th}$ row and $j^{th}$ column. The contribution of the dynamic variation to the resistance can be written $$R_{ij} = R_{ij}^0 + \Delta_1 R_{ij}$$

Also as described hereinabove, the mean value $R_{ij}^0$, in turn, will deviate from its design value $R_0$ because of manufacturing fluctuations. Since all of the devices in the network of this illustration are intended to be nominally identical, the design value of all of the devices is the same. The contribution of the manufacturing fluctuations to the mean value can thus be written $$R_{ij}^0 = R_0 + \Delta_2 R_{ij}$$

where $\Delta_2 R_{ij}$ corresponds to the manufacturing fluctuation of the device in the $i^{th}$ row and $j^{th}$ column.

The measured resistance $R_{ij}$ can now be written $$R_{ij} = R_0 + \Delta_1 R_{ij} + \Delta_2 R_{ij}$$

or, more simply, as $$R_{ij} = R_0 + \Delta R_{ij} \quad (2)$$

where $\Delta R_{ij}$ measures the deviation of the resistance of the device in the $i^{th}$ row and $j^{th}$ column from its design value and is given by $$\Delta R_{ij} = \Delta_1 R_{ij} + \Delta_2 R_{ij} \quad (2)$$

Substitution of equation (2) into equation (1) gives $$R = R_0 + \Delta R = \left[ \sum_j \frac{1}{\sum_i (R_0 + \Delta R_{ij})} \right]^{-1} \quad (3)$$

where $R_0$ is the design resistance of the network (which corresponds to the design resistance of the individual devices) and $\Delta R$ is the deviation of the network from the design resistance. Initial simplification of equation (3) leads to $$R = R_0 + \Delta R = \left[ \sum_j \frac{1}{nR_0 + \sum_i \Delta R_{ij}} \right]^{-1} \quad (4)$$

For the purposes of illustrating the primary beneficial effects associated with the instant invention, we proceed under the assumption that the fluctuations terms $\Delta_1 R_{ij}$, $\Delta_2 R_{ij}$ and $\Delta R_{ij}$ are much smaller in magnitude than the design value $R_0$ for all values of i and j, so that $$\left| \frac{\Delta R_{ij}}{R_0} \right|, \left| \frac{\Delta_1 R_{ij}}{R_0} \right|, \left| \frac{\Delta_2 R_{ij}}{R_0} \right| << 1 \quad (5)$$

A Taylor expansion of the right side of equation (4), truncated under the assumption of equation (5) to the lowest order terms in $\Delta R_{ij}$ leads to $$R_0 + \Delta R = \left[\frac{1}{R_0} - \sum_{i,j} \frac{\Delta R_{ij}}{(nR_0)^2}\right]^{-1}$$

$$= R_0\left[1 - \sum_{i,j} \frac{\Delta R_{ij}}{n^2 R_0}\right]^{-1}$$

Simplifying gives $$\Delta R = \frac{1}{n^2}\sum_{i,j} \Delta R_{ij}$$

$$= \Delta_1 R + \Delta_2 R$$

where $$\Delta_1 R = \frac{1}{n^2}\sum_{ij} \Delta_1 R_{ij}$$

$$\Delta_2 R = \frac{1}{n^2}\sum_{ij} \Delta_2 R_{ij}$$

Also for the purposes of illustration, we assume that the statistical properties of the dynamic ($\Delta_1 R_{ij}$) and manufacturing ($\Delta_2 R_{ij}$) fluctuations are independent. By the statistical properties of $\Delta_1 R_{ij}$, we refer to the distribution in fluctuations of its value over time during repeated operation of the device located at row i and column j. By the statistical properties of $\Delta_2 R_{ij}$, we refer to the distribution of the manufacturing fluctuations generated during the fabrication process over different devices in the network. The design value $R_0$ is such that the mean of both $\Delta_1 R_{ij}$ and $\Delta_2 R_{ij}$ vanishes. Consequently, the means of the networks fluctuations $\Delta_1 R$ and $\Delta_2 R$ vanish, $$\overline{\Delta_1 R} = \frac{1}{n^2}\sum_{ij} \overline{\Delta_1 R_{ij}} = 0$$

$$\overline{\Delta_2 R} = \frac{1}{n^2}\sum_{ij} \overline{\Delta_2 R_{ij}} = 0$$

Of significance in the instant invention, is the beneficial effect of the instant error reduction circuit on the variance of the network relative to the variance of an individual device. The variance of the network resistance is $$\overline{(\Delta R)^2} = \overline{(\Delta_1 R)^2} + \overline{(\Delta_2 R)^2} + 2\overline{\Delta_1 R \Delta_2 R}$$

Under the assumption of the independence of the dynamic and manufacturing fluctuations, the cross correlation term $\overline{\Delta_1 R \Delta_2 R}$ vanishes and the network variance becomes $$\overline{(\Delta R)^2} = \overline{(\Delta_1 R)^2} + \overline{(\Delta_2 R)^2}$$

The dynamic fluctuations $\Delta_1 R$ have a variance $$\overline{(\Delta_1 R)^2} = \frac{1}{n^4}\sum_{ijkl} \overline{\Delta_1 R_{ij} \Delta_1 R_{kl}}$$

Since there is no correlation in the dynamic fluctuations of different devices, this simplifies to $$\overline{(\Delta_1 R)^2} = \frac{1}{n^4}\sum_{ij} \overline{(\Delta_1 R_{ij})^2}$$

Under the simplifying assumptions at work in this illustration, the dynamic variances of all the devices are the same. Letting $\sigma_1^2$ be the variance of an individual device leads to $$\overline{(\Delta_1 R_{ij})^2} = \sigma_1^2$$

and consequently, the variance of the network dynamic fluctuation can be written $$\overline{(\Delta_1 R)^2} = \left(\frac{1}{n^4}\right) n^2 \sigma_1^2 = \frac{\sigma_1^2}{n^2} \quad (6)$$

Equation (6) indicates that inclusion of an n×n network in the instant error reduction circuit provides for a dynamic error correction that reduces the operational noise by a factor of $n^2$ in its variance or n in its standard deviation below its magnitude for a single device. A 2×2 network such as that shown in FIGS. 3A and 3B, for example, leads to a fourfold reduction in the variance of the measured resistance relative to that of a single device.

In a preferred embodiment, the decrease in the variance of the dynamic fluctuation provided by the instant error reduction circuit relative to a single device is at least linear in the number of devices included in the network of chalcogenide devices of the error reduction circuit. In a more preferred embodiment, the decease in the variance of the dynamic fluctuations is quadratic or greater in the number of devices included in the network of chalcogenide devices of the error reduction circuit.

The manufacturing fluctuations $\Delta_2 R$ have a variance $$\overline{(\Delta_2 R)^2} = \frac{1}{n^4}\sum_{ijkl} \overline{\Delta_2 R_{ij} \Delta_2 R_{kl}}$$

Since the devices in the network of the instant error reduction circuit will typically be fabricated at the same time and in immediate spatial proximity to one another, the cross-correlations of the manufacturing fluctuation cannot be neglected. Consequently, we distinguish between autocorrelation and crosscorrelation when considering the variance of the manufacturing fluctuations $$\overline{(\Delta_2 R_{ij})^2} = \sigma_2^2, \forall ij = kl$$

$$\overline{(\Delta_2 R_{ij} \Delta_2 R_{kl})} = c\sigma_2^2, \forall ij \neq kl$$

where c is a correlation coefficient whose magnitude is less than or equal to one and whose value is assumed for the purposes of this illustration to be the same for all pairs. Combining results provides the following for the variance of the manufacturing fluctuation of the network $$\overline{(\Delta_2 R)^2} = [1 + (n^2 - 1)c]\frac{\sigma_2^2}{n^2} = \left[c + \frac{1-c}{n^2}\right]\sigma_2^2 \quad (7)$$

The minimum variance in the manufacturing fluctuation is zero, while the maximum variance occurs when c=1. The variance of the manufacturing fluctuation is thus within the following range:

$$0 \le \overline{(\Delta_2 R)^2} \le \sigma_2^2$$

For a given value of c, the latter of equations (7) indicates that as n increases, the variance of the manufacturing fluctuations approaches $c\sigma_2^2$, so that the instant error reduction circuit provides a reduction in the variance of the manufacturing error by a factor of at least c.

The instant invention thus provides an error reduction circuit that reduces both the dynamic error and manufacturing error associated with the read out of the resistance or other output response of chalcogenide devices. By providing an error reduction circuit comprising a network of devices at an X-Y intersection of addressing lines or conductive strips, the error reduction advantage has been shown to scale according to the number of devices in the network. The instant invention extends generally to error reduction circuits that include networks of chalcogenide devices of arbitrary size, including rectangular (n×m), linear (n×1 or 1×n), and non-orthogonal arrays. The principles of the instant invention further extend to the operation of chalcogenide devices in the accumulation or cognitive mode of operation and error reduction circuits that include chalcogenide devices that are operated in the accumulation or cognitive mode of operation are within the scope of the instant invention.

Figure 4:
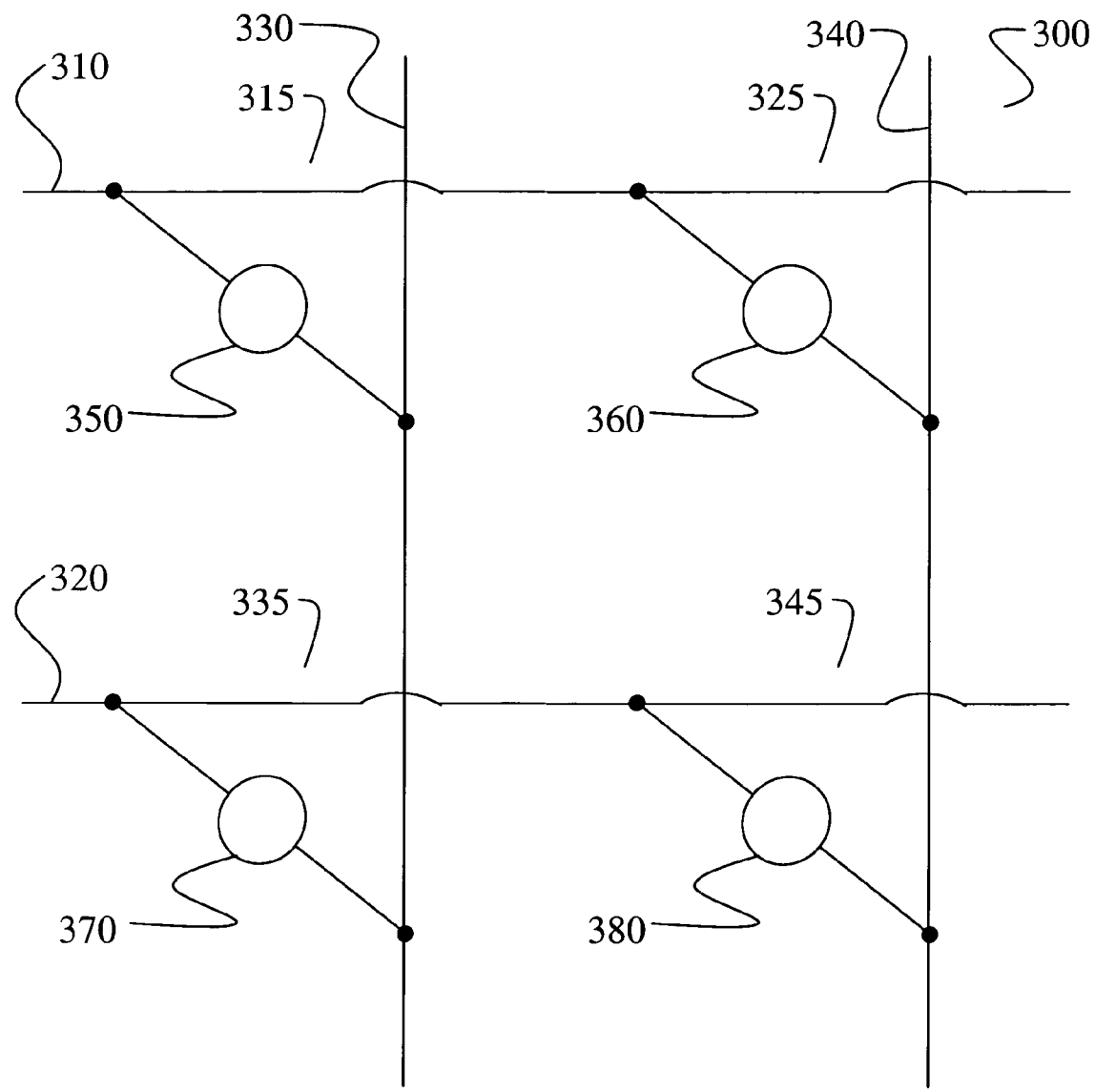
FIG. 4. A portion of an array having array elements that include the error reduction circuit of the instant invention.

The instant error reduction circuit can further be incorporated into an array having a plurality of array elements located at the crossover junction of conductive strips, where each array element includes the instant error reduction circuit, as illustrated in FIG. 4. FIG. 4 shows a portion of an array 300 that includes a 2×2 grid of array elements. FIG. 4 shows horizontal conductive strips 310 and 320, vertical conductive strips 330 and 340, with array elements generally depicted at 315, 325, 335, and 345 which include error reduction circuits 350, 360, 370, and 380, respectively, according to the instant invention. For each array element, an error reduction circuit interconnects a horizontal conductive strip and a vertical conductive strip. Each error reduction circuit includes a network of chalcogenide devices as described hereinabove. The networks may be n×n, n×m, n×1, 1×n or non-orthogonal arrays as described hereinabove. The error reduction circuits 350, 360, 370 and 380 provide for a reduction in the errors associated with the dynamic fluctuations and manufacturing fluctuations at their respective elements in the array, relative to an analogous array that includes only one chalcogenide device for each array element. The error reduction circuits included for the different array element of the array may include networks of the same or different size and arrangement and may be programmed into the same or different states.

Figure 5A:
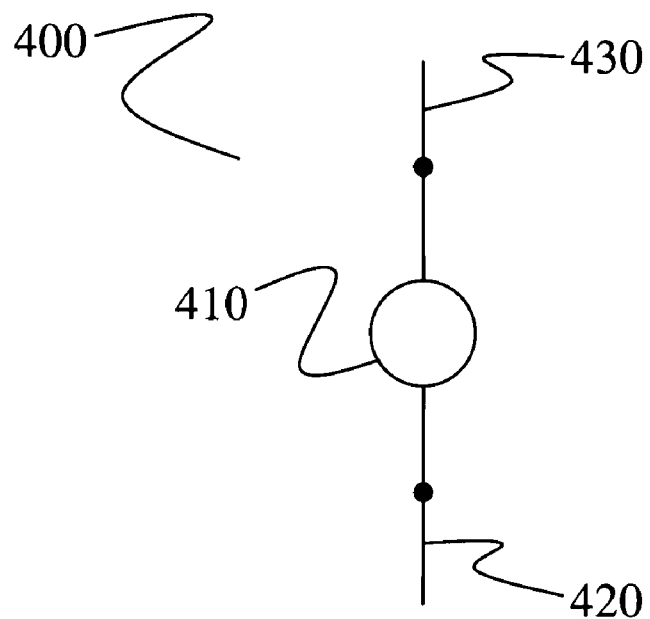
FIG. 5A. An array element including an error reduction circuit interconnected between conductive strips.
Figure 5B:
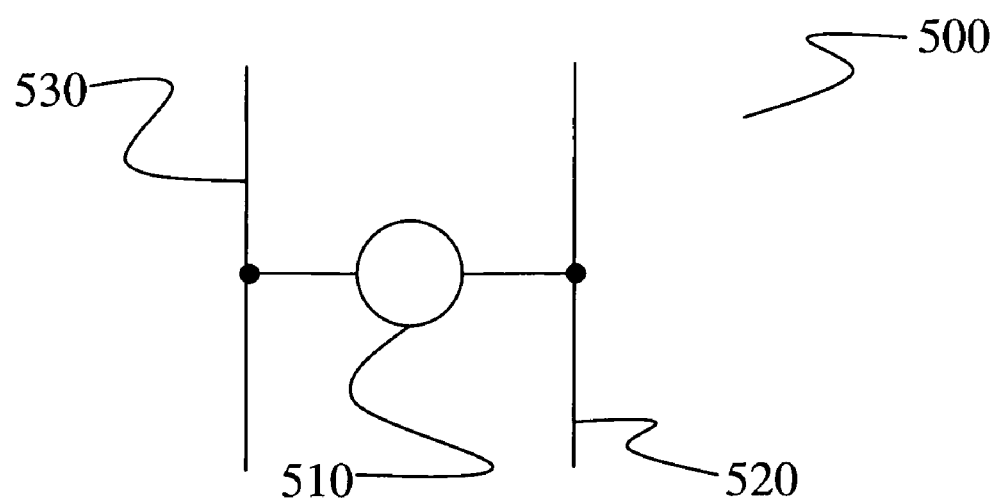
FIG. 5B. An array element including an error reduction circuit interconnected between conductive strips.

The instant invention further includes embodiments in which the error reduction circuit is used as an interconnection device placed between conductive strips in an array or otherwise generally. Such a configuration may also be referred to as an array element. In these embodiments, the instant error reduction circuit regulates the resistance or current flow between a pair of interconnected conductive strips. The conductive strips in this embodiment may cross or be otherwise arranged such as in a parallel or co-linear arrangement. FIG. 5A, for example, shows array element 400 that includes error reduction circuit 410 interconnected between conductive strips 420 and 430. As another example, FIG. 5B shows array element 500 that includes error reduction circuit 510 interconnected between conductive strips 520 and 530.

Representative chalcogenide materials are those that include one or more elements from column VI of the periodic table (the chalcogen elements) and optionally one or more chemical modifiers from columns III, IV or V. One or more of S, Se, and Te are the most common chalcogen elements included in the chalcogenide materials of the instant array elements and error reduction circuits. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons that may facilitate the formation of a conducting filament. Trivalent and tetravalent modifiers such as Al, Ga, In, Ge, Sn, Si, P, As and Sb enter the chain and ring structures of chalcogen elements and provide points for branching and crosslinking. In a preferred embodiment, the chalcogenide material includes Te. In another preferred embodiment, the chalcogenide material includes Se. In a more preferred embodiment, the chalcogenide material includes Te and Ge. In another more preferred embodiment, the chalcogenide material includes Te and Sb. In a most preferred embodiment, the chalcogenide material includes Te, Ge and Sb.

The foregoing discussion and description are not meant to be limitations upon the practice of the present invention, but rather illustrative thereof. It is to be appreciated by persons of skill in the art that numerous equivalents of the illustrative embodiments disclosed herein exist. It is the following claims, including all equivalents and obvious variations thereof, in combination with the foregoing disclosure which define the scope of the invention.

We claim:

1. An array element comprising:
    a first conductive strip;
    a second conductive strip; and
    an error reduction circuit interconnecting said first and second conductive strips, said error reduction circuit comprising a network of chalcogenide devices, said network including at least two chalcogenide devices.

2. The array element of claim 1, wherein said at least two chalcogenide devices of said network are connected in series between said conductive strips.

3. The array element of claim 1, wherein said at least two chalcogenide devices of said network are connected in parallel between said conductive strips.

4. The array element of claim 1, wherein said network includes at least two chalcogenide devices connected in parallel and at least two chalcogenide devices connected in series between said conductive strips.

5. The array element of claim 1, wherein said first and second conductive strips are parallel.

6. The array element of claim 1, wherein the variance in the dynamic fluctuation of said error reduction circuit is less than the variance in the dynamic fluctuation of one of said chalcogenide devices within said network of said error reduction circuit.

7. The array element of claim 6, wherein the variance in the manufacturing fluctuation of said error reduction circuit is less than the variance in the manufacturing fluctuation of one of said chalcogenide devices within said network of said error reduction circuit.

8. The array element of claim 1, wherein the variance in the dynamic fluctuation of said error reduction circuit decreases as the number of chalcogenide devices in said network of said error reduction circuit increases.

9. The array element of claim 8, wherein said decrease in said variance in the dynamic fluctuation is at least linear in the number of devices in said network.

10. The array element of claim 8, wherein said decrease in said variance in the dynamic fluctuation is quadratic or greater in the number of devices in said network.

11. The array element of claim 1, wherein the variance in the manufacturing fluctuation of said error reduction circuit is less than the variance in the manufacturing fluctuation of one of said chalcogenide devices within said network of said error reduction circuit.

12. The array element of claim 11, wherein said variance in the manufacturing fluctuation is reduced by a factor of less than or equal to the correlation coefficient of said chalcogenide devices within said network of said error reduction circuit.

13. The array element of claim 1, wherein the variance in the manufacturing fluctuation of said error reduction circuit decreases as the number of chalcogenide devices in said network of said error reduction circuit increases.

14. The array element of claim 1, wherein said chalcogenide devices of said network include at least two memory devices, said memory devices having a plurality of memory states, said memory states being distinguishable in resistance.

15. The array element of claim 14, wherein said plurality of states includes memory states whose resistance differs by at least a factor of 10.

16. The array element of claim 14, wherein said plurality of states includes memory states whose resistance differs by at least a factor of 100.

17. The array element of claim 14, wherein said plurality of states includes memory states whose resistance differs by at least a factor of 1000.

18. The array element of claim 14, wherein said network includes at least four of said memory devices.

19. The array element of claim 1, wherein said chalcogenide devices of said network include at least two chalcogenide devices operating in the cognitive mode of functionality.

20. The array element of claim 1, wherein said chalcogenide devices of said network include at least one memory device and at least one device operating in the cognitive mode of functionality.

21. An array, said array comprising a plurality of the array elements of claim 1.

* * * * *